United States Patent [19]
Brockmann

[11] Patent Number: 4,818,902
[45] Date of Patent: Apr. 4, 1989

[54] INTEGRATED CIRCUIT COMPONENT

[75] Inventor: Werner Brockmann, Altenbeken, Fed. Rep. of Germany

[73] Assignee: Nixdorf Computer AG, Fed. Rep. of Germany

[21] Appl. No.: 937,560

[22] Filed: Dec. 3, 1986

[30] Foreign Application Priority Data

Dec. 9, 1985 [DE] Fed. Rep. of Germany ....... 3543471

[51] Int. Cl.⁴ ...................... G01F 7/38; H03K 19/094
[52] U.S. Cl. .................................... 307/465; 307/468; 307/469; 307/243; 364/716
[58] Field of Search ........................ 307/465, 468–469, 307/243; 364/716

[56] References Cited

U.S. PATENT DOCUMENTS 4,668,880  5/1987  Shoji ................................. 307/469

FOREIGN PATENT DOCUMENTS

| 0111262 | 6/1984 | European Pat. Off. | ............ 307/465 |
| 0123864 | 9/1979 | Japan | ................... 307/465 |
| 0133040 | 8/1983 | Japan | ................... 307/465 |
| 0045722 | 3/1984 | Japan | ................... 307/465 |
| 0229425 | 11/1985 | Japan | ................... 307/465 |
| 1077052 | 2/1984 | U.S.S.R. | ............... 307/465 |

Primary Examiner—John S. Heyman
Assistant Examiner—M. R. Wambach
Attorney, Agent, or Firm—Harness, Dickey & Pierce

[57] ABSTRACT

An integrated circuit component, particularly a programmable logic array (PLA), includes at least one logic AND-array and a logic OR-array connected thereto. Some of the input lines of the PLA are sued to control the selection of output signals of the OR-array via a multiplexer thereby reducing the complexity and necessary programming of the PLA without a loss of flexibility.

9 Claims, 1 Drawing Sheet

INTEGRATED CIRCUIT COMPONENT

The invention relates to a component manufactured in integrated technology for providing integrated circuits, said component having a plurality of inputs, at least one logic AND-array and a logic OR-array connected in series downstream from said logic AND-array, whereby at least one of the logic arrays is programmable.

Such types of components, known as "programmable logic arrays", may be programmable by means of masks, or electrically. The electrical programming can take place, for example, in the same way as a Programmable Read Only Memory (PROM). The components' flexibility is based on their capability to implement random Boolean equations directly, for example. Thus, the circuit can be specified using relatively simple software tools. The electrical programmablility offers the advantage that the users themselves can define special circuits, even in small numbers, without extensive time and cost expenditure. The appropriate connections within the logic arrays are made, or all other connections are interrupted, so that a junction at the intersection points of the logic arrays is generated according to a specification. The structure of the logic arrays thereby offers the advantage that all possible logical operations can be performed among the input variables and, if appropriate, with feed-back signals. For these logical operations, the "WIRED-AND", "WIRED-OR", "WIRED-NOR", or "WIRED-NAND" operations can be utilized in the programmable sections.

The structures of the kind described above known up to now have the disadvantage that only a small number of all possible combinations of the input signals may be coded out in the logic AND-array, so that the number of possible product terms constitutes a bottleneck. Possibly, this may lead to a restriction in the complexity of the component's functions. The effort required for every programmable intersection point due to the programmability, is many times greater in comparison to a component with a fixed given logical structure. Likewise, this increases the necessary area for the component, and its costs.

The object of the invention is to provide a component of the kind described above such that its complexity regarding the component's area, the necessary lines and the programming, is reduced without a loss of flexibility or that, at relatively small cost, the flexibility will be increased.

This task is solved by the invention in that a selector is connected in series downstream from the logic OR-array, selecting at least a part of the outputs of the logic OR-array as a function of control signals. A selector, by definition, is an element or a circuit configuration, which selects certain signals from primary signals (data signals) which are supplied via a primary group of signal lines, depending upon secondary signals (control signals) arriving via a secondary group of lines.

It is now possible to divide the inputs of the component into two groups, the inputs of one group being fed to the logic AND-array in the established manner, while the inputs of the second group are connected with the control inputs of the selector. Due to the fact that, with a given total number of inputs, the number of inputs of the logic AND-array is decreased, the size of the logic array is reduced, assuming a constant number of product terms, while the flexibility of the component and the complexity of the possible functions is increased. On the other hand, with the number of functions being constant, the number of product terms can be decreased with respect to these inputs, and thereby the size of the logic AND-array reduced in two respects. The logic OR-array is generally structured in such a way that, for s control inputs, $2^s$ outputs of the logic OR-array, which are selected in accordance with the s control inputs, are allocated to each output of the selector.

Aside from requiring less area, there is usually also a gain in processing speed. Besides, at the same time, a reduction of the power consumption is to be expected through the less complex design. Furthermore, the structure according to the invention offers the advantage that the minimizing of the logic is simplified and designed more effectively, since the selector control inputs are completely decoded, unlike the data inputs, where complete decoding is impossible due to the limited number of product terms. Thus, an additional degree of freedom is generated, namely the allocating of inputs.

The solution according to the invention is applicable to all types of programmable logic arrays, whether they are connected with registers and/or logic output circuits, or have feed-backs.

The inputs of the component used for control of the selector can be connected with the control inputs of the selector either directly or via lines of the logic AND-array and the logic OR-array. In the latter case, the delay differences between both input signal groups, i.e. between the data signals and the control signals, are eliminated.

In place of a fixed preset selector, it may also be either entirely or partially programmable. Thus, complete decoding is no longer necessary, and it allows for a reduction of its size and the size of the logic OR-array.

The selector can also be controlled by feed-back signals or by internal signals, e.g., outputs of the logic AND- and/or the logic OR-array, or by registers. Also, if appropriate, several selectors can be cascade-connected in series. In addition, the structure according to the invention can be combined with other circuit components on the same substrate (chip).

The following description will further clarify the invention along with the attached drawings of the invention in which.

Figure 1:
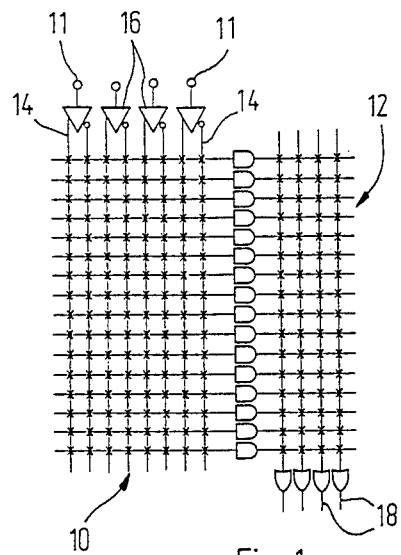
FIG. 1 shows a schematic representation of a known programmable logic array.

FIG. 1 shows a conventional programmable logic array with a matrix-shaped logic AND-array 10 with inputs 11, followed by a logic OR-array 12. Likewise, this logic OR-array 12 is matrix-shaped. The input signals are fed to the lines 14 of the logic AND-array 10, directly and invertedly through the phase splitters 16. The output signals appearing at the outputs 18 of the logic OR-array 12 can be further processed as desired. At the intersection points of the lines of the logic arrays, the connections between the intersecting lines can be interrupted. The component leaves the factory with all the connections intact. For programming purposes, the superfluous connections are burned out by excess voltage.

The number of connections directly determines the size of the component and thereby, aside from the delay time of the signals, also the manufacturing costs.

Figure 2:
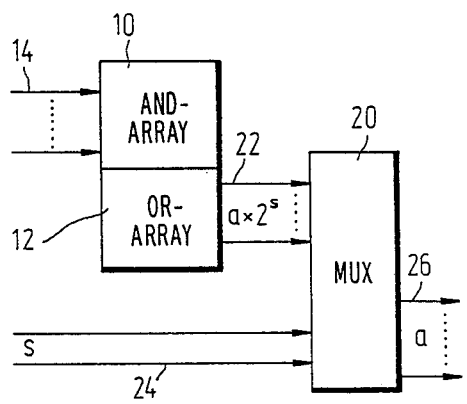
FIG. 2 shows a schematic representation of a structure according to the invention.

FIG. 2 shows a schematic construction of a component according to the invention. A selector, for example a multiplexer 20, is connected in series downstream from the logic OR-array 12. The selector's data inputs 22 are connected to the outputs 18 of the logic OR-array 12. A part of the inputs 11 of the logic AND-array 10 is connected with the control inputs 24 of the selector 20. The logic AND-array can be reduced in size to adapt to the remaining inputs 14. Conversely, for a given area of the component, the flexibility, as compared to the structure according to FIG. 1, can be increased by keeping the number of product terms of the logic AND-array the same. Generally, $2^s$ outputs 18 of the logic OR-array 12 are allocated to each of the a outputs 26 of the selector 20, so that the outputs 18 of the logic OR-array can be arranged in a groups of $2^s$ outputs.

The control signals reaching the control inputs 24 may also be looped through the logic AND-array and the logic OR-array in order to avoid delay differences between the control signals and the data signals reaching the data inputs 22.

Figure 3:
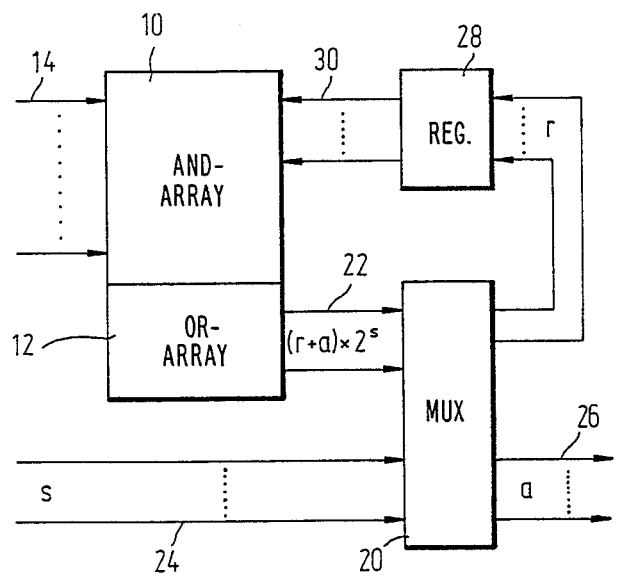
FIG. 3 shows an alternative embodiment.

FIG. 3 shows a variation in which r outputs of the selector 20 fed to a register 28, the outputs of which, in turn, are fed back to the logic AND-array 10. Also, a simple feed-back without register 28 can be provided. One obtains $(r+a) \cdot 2^s$ output signals at the output of the logic OR-array 12, which are put on the selector 20. Also the control inputs of the selector 20 can be supplied with feed-back signals. Likewise, the selector can be controlled by internal signals. Any number of additional integrated circuit components may be added downstream from the remaining outputs of the selector.

As with conventional logic arrays, the manufacturing technology is of no consequence for a configuration according to the invention. Likewise, the type of programming used for the structure according to the invention, is not important. Depending on the point of view, the expenses for the necessry component area and/or the programming can be considerably decreased while, at the same time, shortening delay times of the signals and increasing flexibility of the component. The reduced effort for programming is especially essential, if one considers that for the programming a selection of the programming points, the transistors for each programming point, power sources, programming devices and programming time must be available. The structure according to the invention can be adapted to the individual needs by variations of the different parameters as the case may be depending if one is primarily interested in saving component area, reducing programming efforts, or in decreasing the signal delay times. Since not all benefits appear at the same time or to the same extent, it is necessary to optimize the parameters.

In the following example, two entirely random functions, y1 and y2 shall be implemented from the input variables A, B and C in the conventional manner and according to the solution offered by the invention. Also, the number of intersection points of the logic arrays necessary for realizing the functions, according to the solution of the invention, is to be compared with the corresponding number for a conventional system.

Table 1 shows the values of the input variables A, B and C and the values of the functions y1 and y2 derived from these input variables.

TABLE 1

| A | B | C | y1 | y2 |
|---|---|---|----|----|
| 0 | 0 | 0 | 1  | 0  |
| 0 | 0 | 1 | 1  | 1  |
| 0 | 1 | 0 | 0  | 0  |
| 0 | 1 | 1 | 1  | 0  |
| 1 | 0 | 0 | 0  | 1  |
| 1 | 0 | 1 | 1  | 0  |
| 1 | 1 | 0 | 1  | 0  |
| 1 | 1 | 1 | 1  | 1  |

For realization of these functions, there are, on principle, the following formulations for the solution: the direct representation, the minimized representation, the realization of the complementary functions and minimization of the complementary functions. In the following, only the direct formulation is to be regarded. Accordingly, $$y1n = \overline{ABC} + \overline{AB}C + \overline{A}BC + A\overline{BC} + AB\overline{C} + ABC$$

This equation can also be written as follows, when variables A, B or C are factored out, one at a time:

$$y1A = \overline{A} \cdot (\overline{BC} + \overline{B}C + BC) + A \cdot (\overline{BC} + B\overline{C} + BC)$$

$$y1B = \overline{B} \cdot (\overline{AC} + \overline{A}C + AC) + B \cdot (\overline{AC} + A\overline{C} + AC)$$

$$y1C = \overline{C} \cdot (\overline{AB} + AB) + C \cdot (\overline{AB} + \overline{A}B + A\overline{B} + AB)$$

For y2n or y2A, y2B, y2C, one obtains in the same way:

$$y2n = A\overline{BC} = \overline{A}\overline{B}C + ABC$$

$$y2A = \overline{A} \cdot \overline{B}C + A \cdot (\overline{BC} + BC)$$

$$y2B = \overline{B} \cdot (\overline{A}C + A\overline{C}) + B \cdot AC$$

$$y2C = \overline{C} \cdot A\overline{B} = C \cdot (\overline{AB} + AB)$$

With the solution according to the invention, one can put, for example, the variable A, B or C on the control input of the selector, whereas the other two variables are fed to the inputs of the logic AND-array. The last three columns of Table 2 show the number of the intersection points necessary for the logic AND-array, the logic OR-array, and the total, for realizing the functions yin (conventional operations method), and yiA, yiB and yiC (operation according to the solution of the invention).

TABLE 2

| Function | Product Terms | | Intersection Points | |
|---|---|---|---|---|
| | | AND | OR | Total |
| y1n | previous std. | 6 | 2·3×6=36 | 1×6=6 | 42 |
| y1A | A control input | 4 | 2·2×4=16 | 2×4=8 | 24 |
| y1B | B control input | 4 | 2·2×4=16 | 2×4=8 | 24 |
| y1C | C control input | 4 | 2·2×4=16 | 2×4=8 | 24 |
| y2n | previous std. | 3 | 2·3×3=18 | 1×3=3 | 21 |
| y2A | A control input | 3 | 2·2×3=12 | 2×3=6 | 18 |
| y2B | B control input | 3 | 2·2×3=12 | 2×3=6 | 18 |
| y2C | C control input | 3 | 2·2×3=12 | 2×3=6 | 18 |

Here it is evident that for the realization of the functions y1, there is a distinct difference in the number of required intersection points between the conventional solution and the solution according to the invention. If, instead of putting one input variable on the control inputs of the selector, two input variables each are fed, this difference will be even more striking. The number of intersection points required for each of the other formulations can be determined in the very same way.

The number of intersection points is a meaningful parameter, since the number of intersection points directly affects the area requirement for the logical arrays and, also, the requirement for support structures for programming the logical arrays.

I claim:

1. In an integrated circuit component having a plurality of input lines, at least one logic AND-array and a logic OR-array connected thereto, the OR-array having a plurality of outputs, and at least one of the arrays being programmable, wherein the improvement comprises:

selector means having a plurality of data inputs, at least one control input and at least one output, said selector means operating to connect selected inputs to the output as a function of control signals on the control input;

means for connecting at least some of the outputs of the OR-array to inputs of the selector means; and wherein at least one of the input lines of the integrated circuit component is directly connected to a control input of the selector means whereby the outputs of the logic OR-array which are coupled to the output of the selector means is a function of control signals applied to the control input of the selector via the said at least one input line of the integrated circuit component.

2. The integrated circuit component of claim 1 wherein the selector means is programmable.

3. The integrated circuit component of claim 1 wherein said selector means has a plurality of outputs, with the component further comprising:

feedback means for feeding a subset of said outputs from the selector means back to the logic AND-array.

4. The integrated circuit component of claim 3 wherein said feedback means includes a register coupled between the selector means and the logic AND-array.

5. The integrated circuit component of claim 1 wherein said selector means comprises a multiplexer.

6. The integrated circuit component of claim 1 which further includes a second selector means cascade-connected in series with the first selector means.

7. The integrated circuit of claim 1 wherein at least one output of the logic OR-array is routed past the selector means.

8. The integrated circuit component of claim 1 wherein at least one output of the logic AND-array is routed past the selector means.

9. The integrated circuit component of claim 1 wherein a control signal to the selector means is coupled through one of the arrays in order to avoid delay differences between the control signals applied to the selector means and the data signals applied to the selector means.

* * * * *